United States Patent [19]

Hayes et al.

[11] Patent Number: 5,445,450
[45] Date of Patent: Aug. 29, 1995

[54] CIRCUIT BOARD SUPPORT

[75] Inventors: William J. Hayes; Andrew M. Forehand, both of Kokomo; Adrian A. Archuleta, Peru; Paul R. Hinkle, Kokomo; Jerry A. Mundell, Forest; Mark A. Lucterhand, Kokomo, all of Ind.

[73] Assignee: Delco Electronics Corp., Kokomo, Ind.

[21] Appl. No.: 133,923

[22] Filed: Oct. 12, 1993

[51] Int. Cl.⁶ ............................................. A47B 77/08
[52] U.S. Cl. ................................ 312/223.2; 312/223.1
[58] Field of Search .............. 312/223.1, 223.2, 208.1; 361/742, 758, 756, 801, 807, 809

[56] References Cited

U.S. PATENT DOCUMENTS

| | | |
|---|---|---|
| 3,022,448 | 2/1962 | Mason . |
| 3,324,974 | 6/1967 | Champlin et al. . |
| 3,631,297 | 12/1971 | Conner . |
| 4,068,290 | 1/1978 | Wetherbee ........................ 361/756 |
| 4,323,807 | 4/1982 | Sugiara ............................ 312/223.2 |
| 5,144,533 | 9/1992 | Annett ............................. 312/223.1 |
| 5,198,279 | 3/1993 | Beinhaur et al. . |
| 5,261,734 | 11/1993 | Speraw ........................... 312/223.1 |

FOREIGN PATENT DOCUMENTS

| | | | |
|---|---|---|---|
| 2295119 | 12/1987 | Japan ............................ 312/223.2 |
| 6034953 | 2/1994 | Japan ............................ 312/223.1 |

Primary Examiner—José V. Chen
Assistant Examiner—Rodney B. White
Attorney, Agent, or Firm—Mark A. Navarre

[57] ABSTRACT

A support structure and housing arrangement for integrated circuit boards which serves to eliminate displacement and vibrations imposed on circuit boards adapted for use in high vibration environments. The support member provides a wrap-around design which captures the circuit board at both its edges and center to stabilize the circuit board.

4 Claims, 6 Drawing Sheets

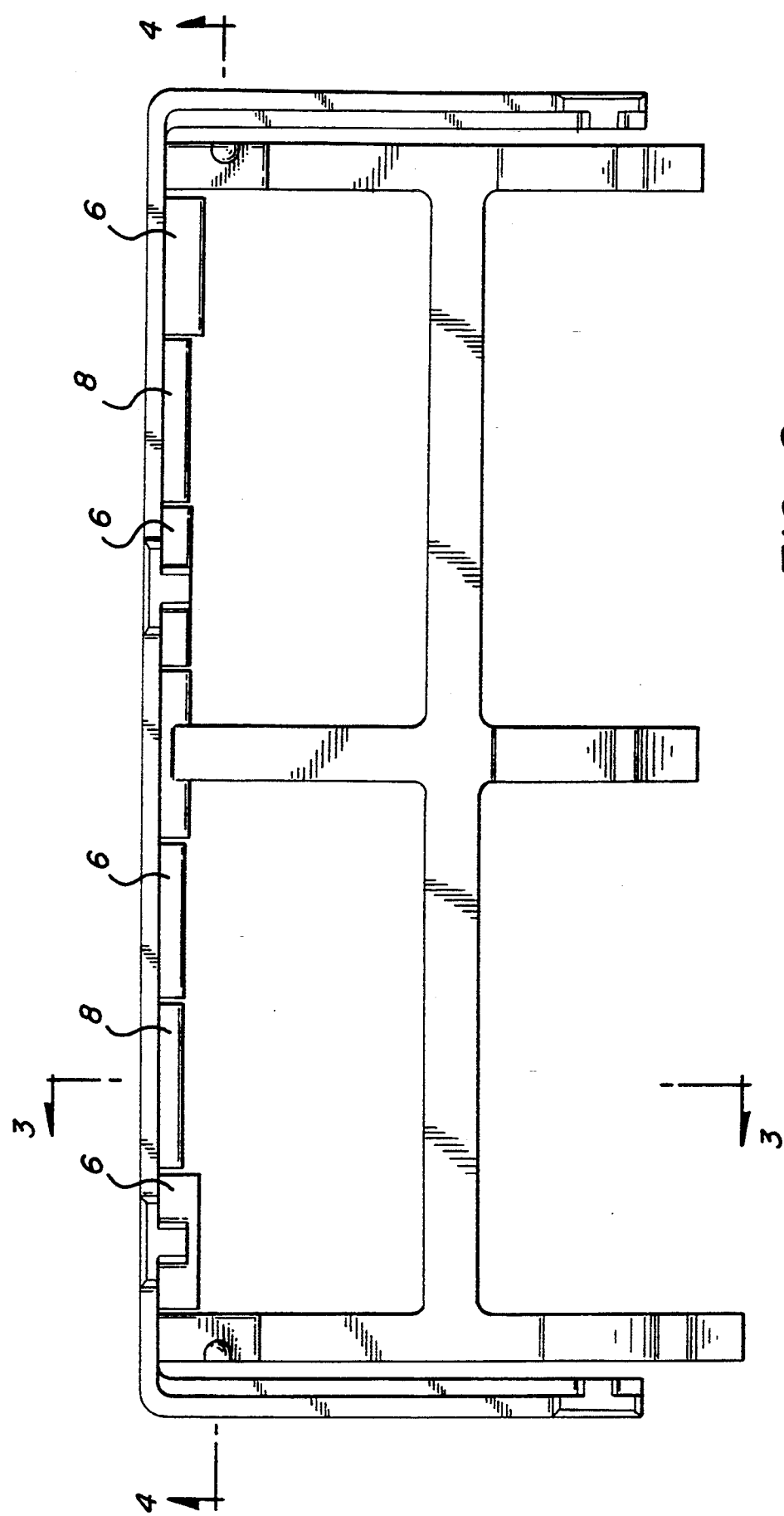

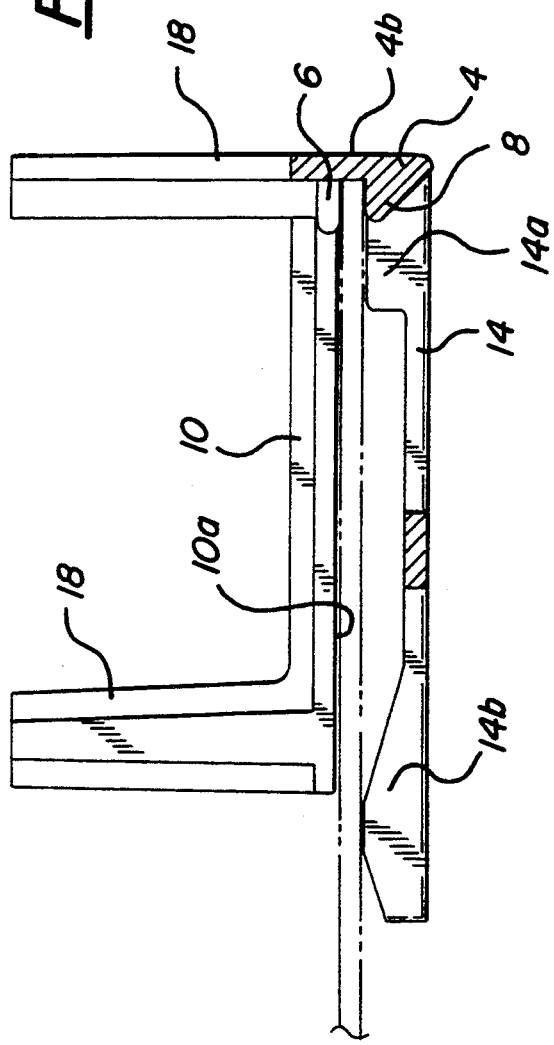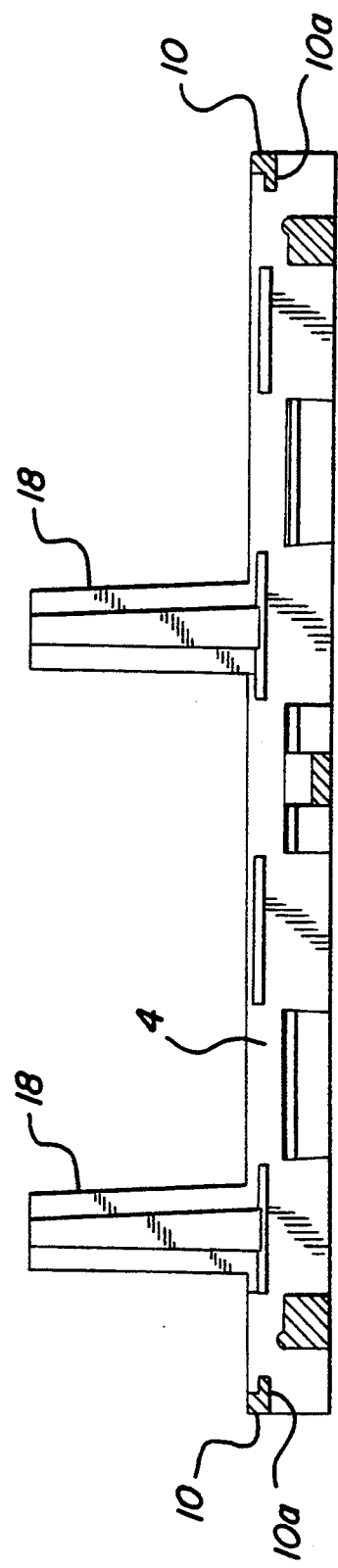

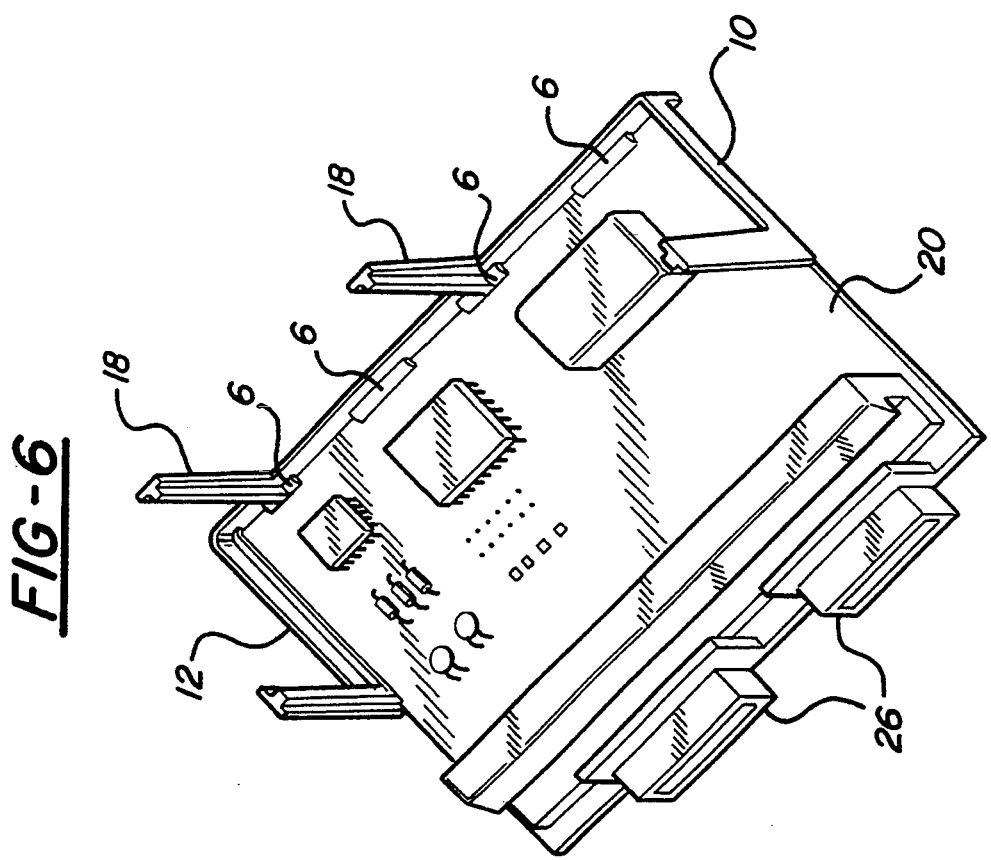
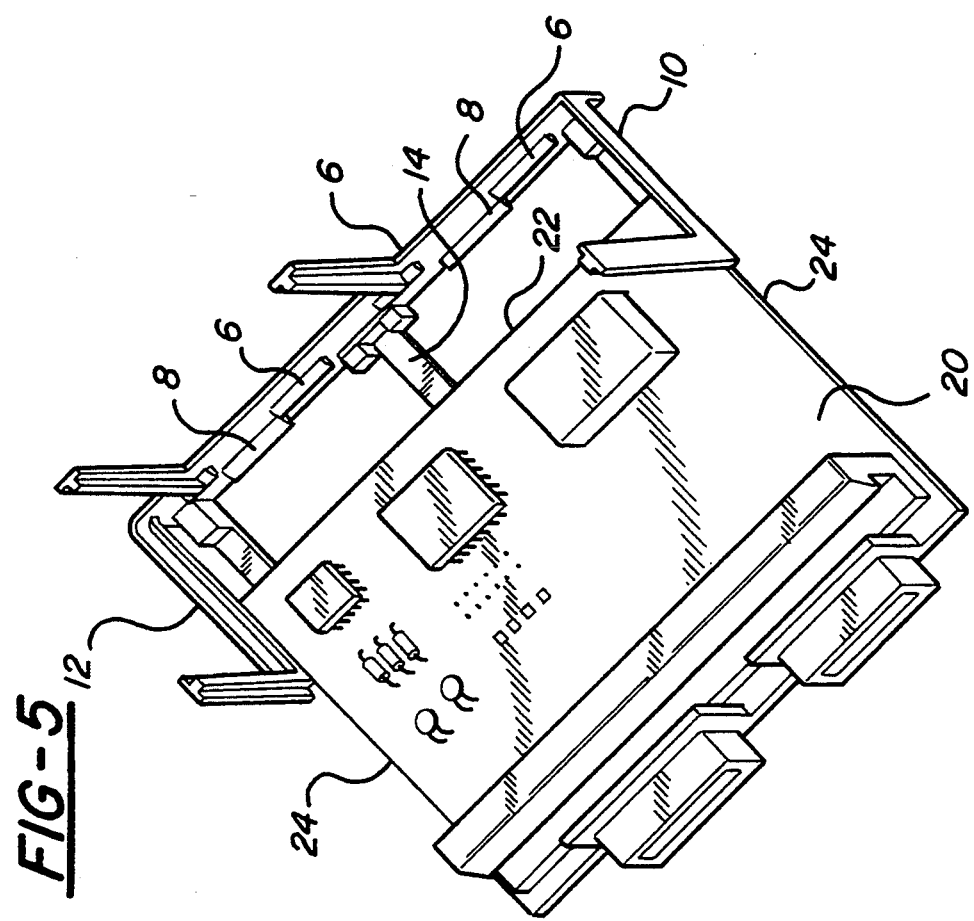

CIRCUIT BOARD SUPPORT

BACKGROUND OF THE INVENTION a) Field of the Invention

The instant invention relates to a support and housing for integrated circuit boards, and in particular to a support structure which serves to eliminate displacement and vibrations imposed on circuit boards adapted for use in high vibration environments.

b) Description of Related Art

Electronic control and regulating systems are being used increasingly in motor vehicles, the components of which are accommodated in housings to protect them from the stresses and vibrations occurring in operation. In installations where the printed circuit boards are subject to vibration, as in moving vehicles such as aircraft and automobiles, the circuit boards tend to vibrate or oscillate with maximum motion of vibration both at their centers and edges due to the resonant response of the board material. This excessive vibration or "oil canning" causes failure of components and solder connections. Moreover, during assembly, many board designs incorporate erasable/programmable read-only memory (EPROM) components which are inserted and retracted from the circuit board after being secured in the housing assembly. This too causes stress failure in the circuit board arrangement.

Many prior art attempts have been made to solve the vibration and stress concentration problem. U.S. Pat. Nos. 5,198,279 and 3,022,448 teach a frame member which is bolted to the board during assembly. However, this arrangement requires additional fasteners and increases assembly time. U.S. Pat. No. 3,324,974 discloses a cross-shaped damper formed of visco-elastic material which secured to one side of the circuit board. U.S. Pat. No. 3,631,297 discloses a rigid foam which is sandwiched between the circuit board and a metallic support plate. In the above designs, it is difficult to provide a circuit board assembly with adequate heat transfer for the relative small space or volume requirements encountered in vehicles designs.

SUMMARY OF THE INVENTION

It is the object of the invention to provide a novel circuit board support which eliminates board flex and stress typically produced in the vehicle environment. The support structure of the invention is designed for ease of assembly and may be incorporated into numerous circuit board and housing arrangements.

More specifically, the invention provides a support structure which incorporates a wrap around arrangement with both edge support and central support for the circuit board so as to eliminate vibration, stress concentrations, and "oil canning". Moreover, the structure of the invention permits the insertion and removal of electrical components, i.e. EPROM components, after the circuit board has been mounted in the housing assembly without the associated board stress.

The simplified design of the invention allows for ease of manufactures and assembly of the control module. Additionally, integrally formed stanchion members project from the support base to engage the housing in order to enhance the gripping force and to prevent lateral displacement of the circuit board.

Other features and advantages of the present invention will become apparent from the following description of the preferred embodiment, taken in conjunction with accompanying drawings, which illustrate, by way of example, the principals of the invention.

BRIEF DESCRIPTION OF THE DRAWINGS

FIG. 2 is a top view of the support structure of FIG. 1.

FIG. 3 is a cross sectional view of the support member taken along section line III—III of FIG. 2.

FIG. 4 is a cross sectional view of the support member taken along section line IV—IV of FIG. 2.

FIG. 5 is a perspective view of the support member partially receiving a circuit board in accordance with the invention.

FIG. 6 is a perspective view of the support member completely receiving a circuit board in accordance with the invention.

DETAILED DESCRIPTION OF THE PREFERRED EMBODIMENT

Figure 1:
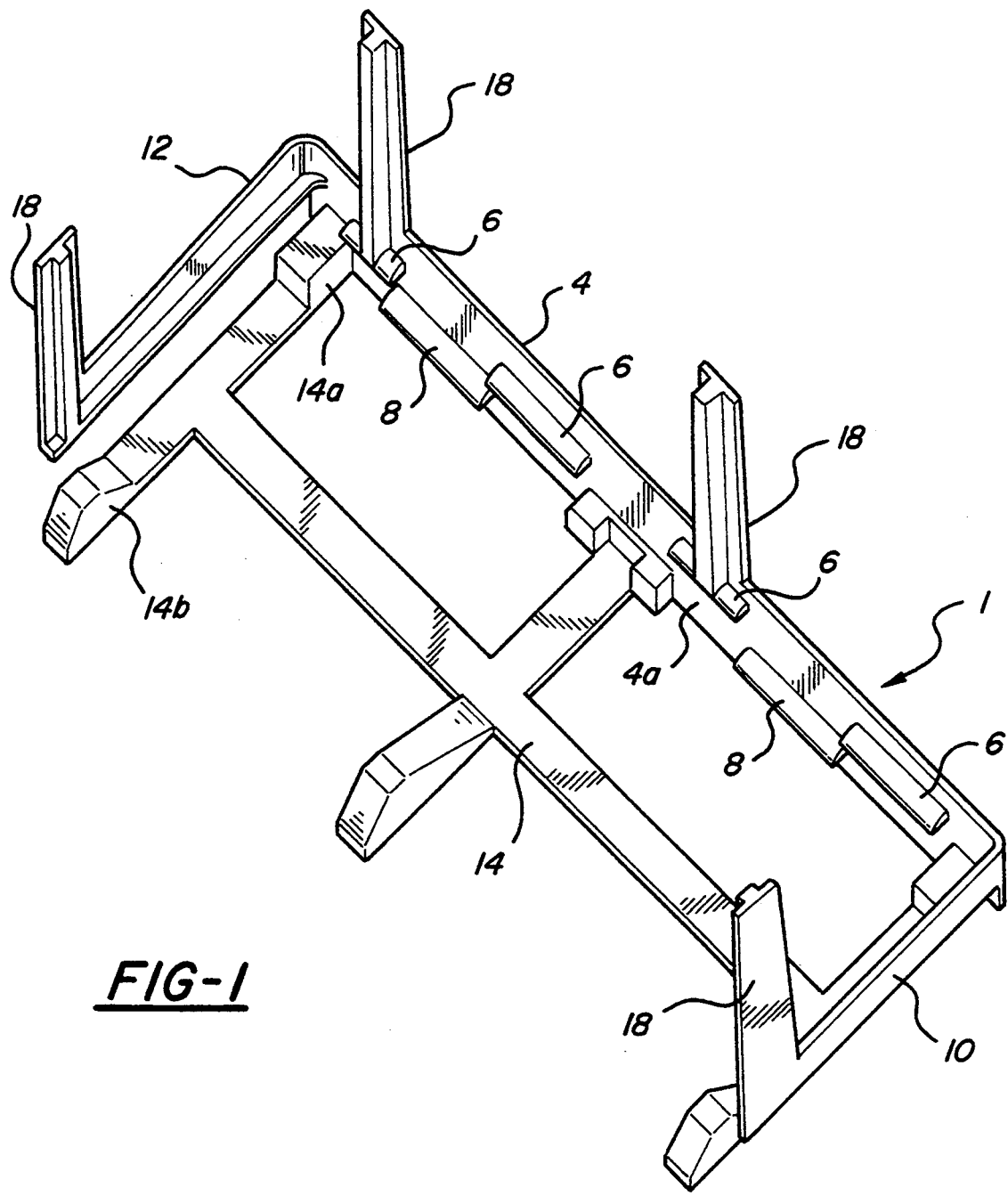
FIG. 1 is a perspective view of the support member of the first embodiment of the invention.

FIG. 1 illustrates the preferred embodiment of the present invention whereby a support member 1 is shown having an edge member 4 with legs 10 and 12 extending therefrom in a perpendicular manner. Also extending from the edge member 4 is surface support portion 14.

The edge member 4 is formed as a wall with front and rear surfaces 4a, 4b respectively, and extends in a longitudinal direction whose length is determined by the dimensions of the circuit board being supported thereby. The legs 10, 12 are cantilevered at each end of the edge member 4 and are formed with an L-shaped cross section to define respective board engaging surfaces 10a, 12a (FIG. 3).

Significantly, both the edge member 4 and legs 10, 12 are provided with stanchions 18 which extend in an upright manner to engage a cover member for surely supporting a circuit board. In the preferred embodiment, the stanchions 18 are formed with a T-shaped cross section with one leg of the T overlying an edge of the circuit board to provide additional stability.

Projecting from the front surface 4a of the edge member 4 are top tangs 6 and bottom tangs 8 which are intermittently disposed to wrap around a circuit board at an edge thereof. With reference to FIG. 3, it is noted that the board engaging surfaces 10a, 12a of the legs 10, 12 lie in the same plane as the lower surface of the top tangs 6 whereby all of these surfaces engage a top surface of a circuit board along the board's edge (shown in dotted lines in FIG. 3).

Similarly, the surface support portion 14 comprises seating portions 14a and 14b which engage and support the lower surface of the circuit board. The seating portions 14a function in the same manner as the bottom tangs 8 and have an upper surfaces which lie in the same plane as the upper surface of the bottom tangs 8, thereby supporting the circuit board along one edge (FIG. 3). Additionally, seating portions 14b engage the lower surface of the circuit board in a supporting fashion. Notably, the seating portions 14b are positioned to engage the circuit board both along edges and at the board's center to ensure uniform support throughout the plane of the circuit board.

The assembly of the control console will now be described with reference to FIGS. 5–8. The circuit board is design to carry conventional electrical components as shown by way of example. The ease of assembly is illustrated in FIG. 5 as the circuit board 20 is partially force fitted between the surface support portion 14 and the legs 10, 12.

FIG. 6 illustrates the circuit board 20 being completely received by the support member 1 whereby the board remains force fitted between the surface support portion 14 and the legs 10, 12. The L-shaped nature of the legs 10, 12 provide an extended surface 10a, 12a which engages the lateral edges 24 of the circuit board. Moreover, the back edge 22 of the circuit board is secured against vibration and bending by the top tangs 6 and bottom tangs 8 (FIG. 5) which wrap around the edge 22. The wrap-around design of the support member 1 is enhanced by the stanchions 18 which overlie a portion of the circuit board at different edges to surely support the board 20 due to their T-shaped design. The stanchions 18 serve to capture the circuit board upon assembly of the housing as the stanchions engage the cover member to apply an assembly or gripping force to the circuit board.

Figure 7:
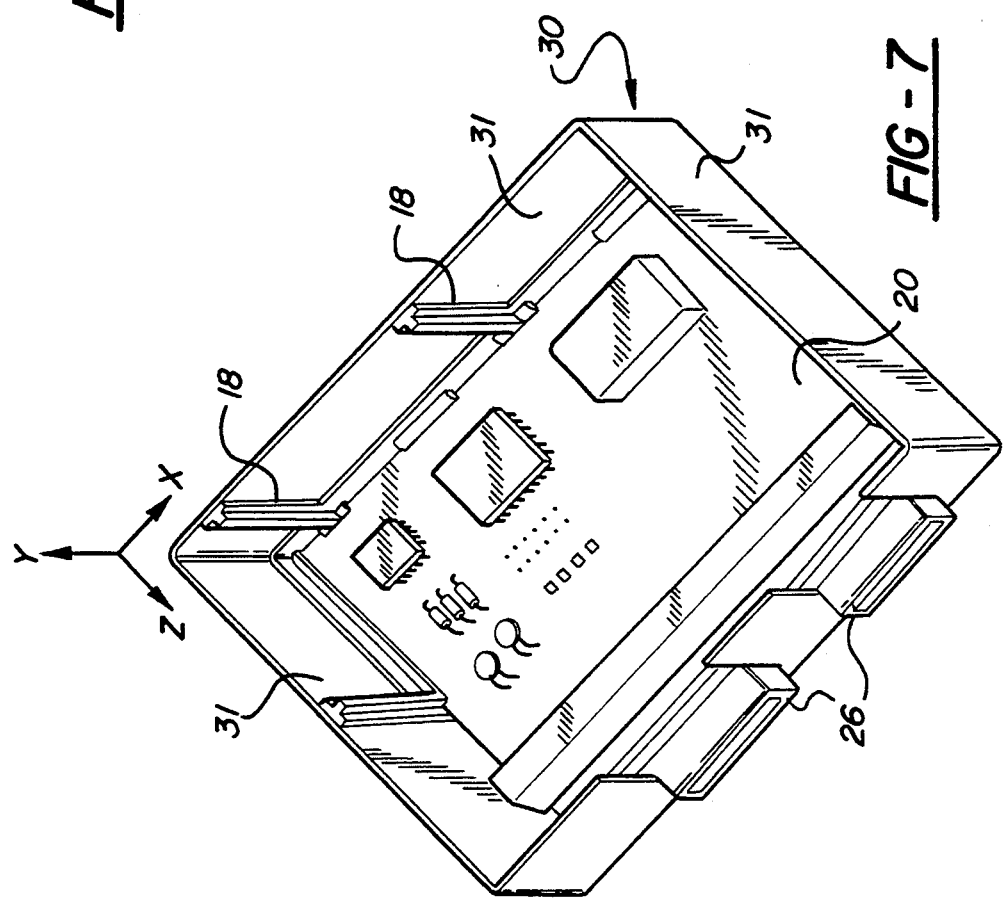
FIG. 7 is a perspective view of the support member and circuit board mounted in a bottom housing portion in accordance with the invention.

The assembly of FIG. 7 is received in a lower housing member 30 with appropriate openings for the plug-in connections 26. The control module assembly is designed such that the stanchions 18 are flush with or extend slightly beyond the top of walls 31 of the lower housing member 30 (FIG. 7).

Figure 8:
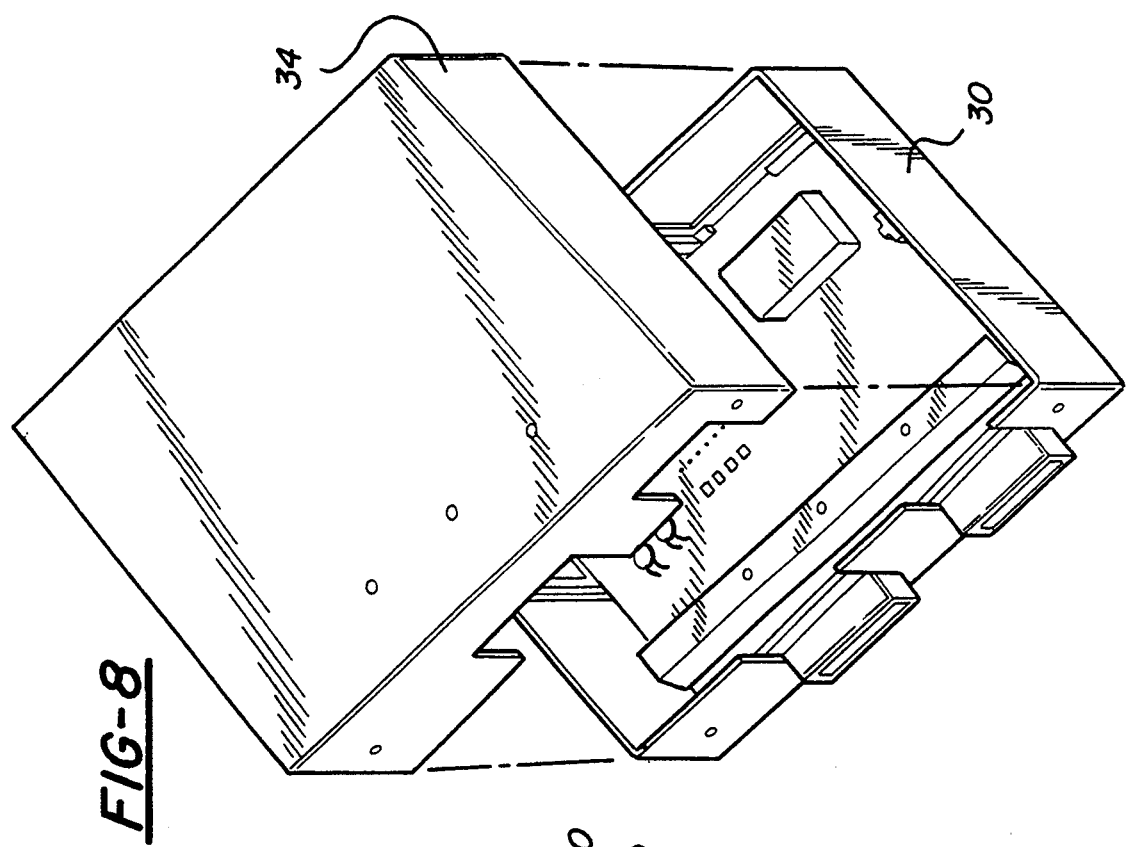
FIG. 8 is a perspective view of the support member, circuit board with the top housing portion being inserted over the housing assembly.

Assembly of the control console is completed by securing the top cover member 34 over the lower housing member 30 as shown in FIG. 8. The top cover member 34 provides additional circuit board securing force as it engages the stanchions 18. The top cover member 34 is secured to the lower housing member 30 by suitable means such as screws or rivets (not shown).

For the above described embodiment, it should be understood that the specific dimensions and location of engagement surfaces may be changed without departing from the spirit and scope of the invention whereby both the edges and central area of the circuit is surely supported against vibration and bending. For instance, the form and location of the stanchions 18 may be redesigned for a particular application provided the wrap-around feature is maintained. Moreover, while the preferred embodiment comprises four stanchions 18, the number of stanchions 18 is merely a design choice depending on the control module being employed. The same is true for the number and arrangement of the tangs 6, 8 and the seating portions 14a, 14b.

Figure 9:
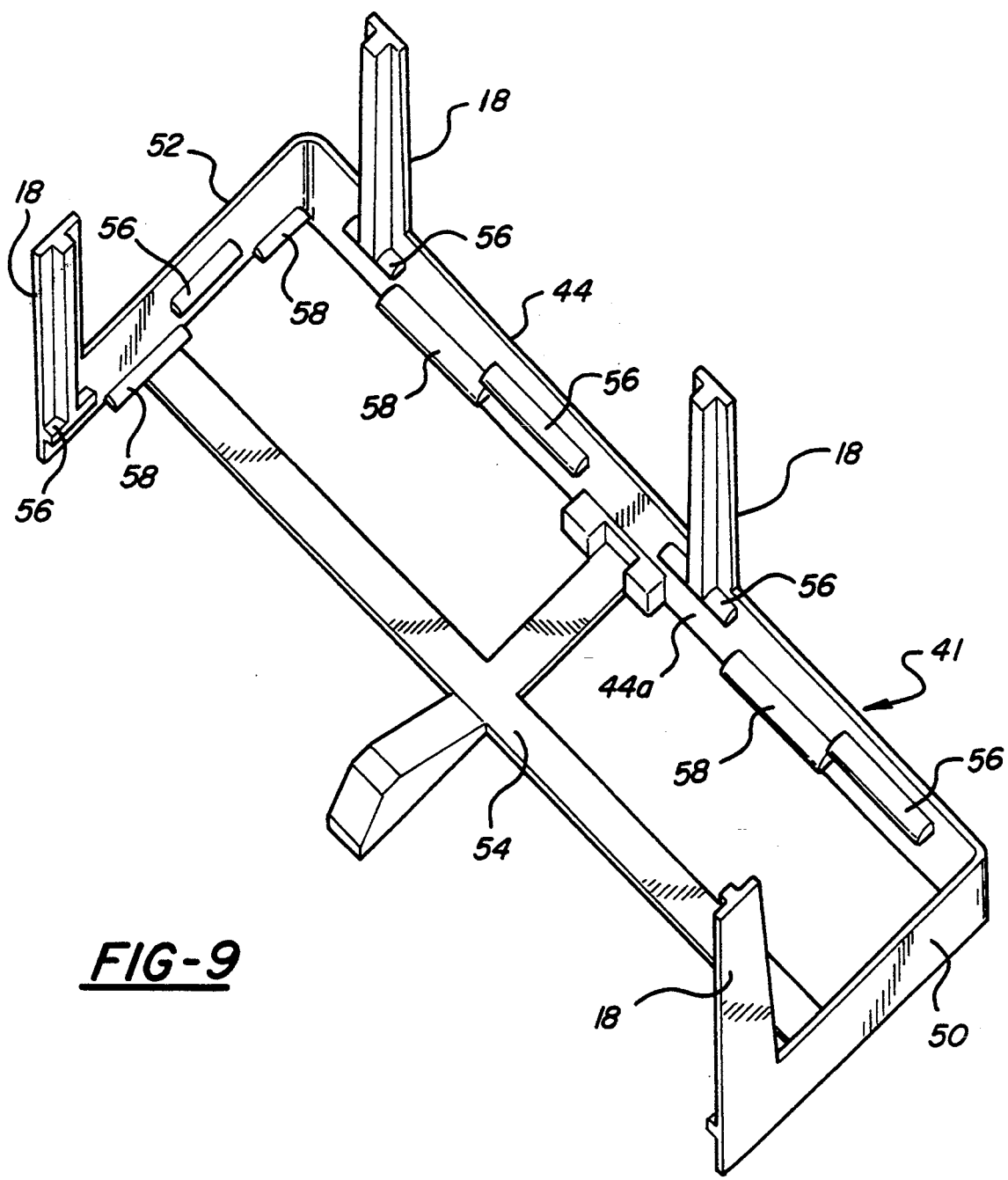
FIG. 9 is a perspective view of the support member of an alternate embodiment of the invention.

FIG. 9 is a perspective view of an alternate embodiment of the support member of the invention. For the alternate embodiment, the legs 10, 12 of the embodiment of FIG. 1 are replaced with lateral wall members 50, 52 which essentially function in the same manner as the edge member 4 of the first embodiment. Specifically, the lateral wall members 50, 52 are provided with upper and lower tangs 56, 58 which wrap around the lateral edges of the circuit board to prevent vibration and bending. The tangs 56, 58 define a planar groove into which the lateral edges of the circuit board are fitted. Once again, stanchions 18 extend in an upright manner from selective upper tangs 56 to capture the edge of the circuit board. As with the first embodiment, the stanchions 18 are designed to engage the cover member of the housing for additionally gripping the edge of the circuit board any to prevent and displacement of the support structure with the housing arrangement.

The assembly of the support structure of the alternate embodiment of FIG. 9 follows the assembly procedure as described with reference to FIGS. 5–8.

While the invention has been particularly shown and described with reference to a preferred embodiment, it will be understood by those having ordinary skill in the art that various changes in form and detail may be made therein without departing from the spirit and scope of the invention.

We claim:

1. A support structure for minimizing vibration and bending in a circuit board arrangement to which are soldered electrical articles of various shapes and dimensions, said support structure being received in a housing means for at least partially encapsulating said circuit board, said structure comprising:

a first edge support means for supporting said circuit board along a first edge thereof within said housing means, said first edge support means comprising projections which define a planar groove adapted to receive said first edge;

lateral support means for supporting said circuit board along at least a second edge;

stanchion means for stabilizing said support structure; and surface support means for supporting said circuit board along a planar surface, said surface support means including a leg member cantilevered from said first edge support means, said leg member gradually approaching the surface of said circuit board as said leg projects from said first edge support until said leg engages and supports said circuit board in a central portion of said circuit board free of said soldered electrical articles.

2. A support structure for minimizing vibration and bending in a circuit board arrangement to which are soldered electrical articles of various shapes and dimensions, said support structure being received in a housing means for at least partially encapsulating said circuit board, said structure comprising:

a first edge support means for supporting said circuit board along a first edge thereof within said housing means, said first edge support means comprising projections which define a planar groove adapted to receive said first edge;

lateral support means for supporting said circuit board along at least a second edge, including a leg member cantilevered from said first edge support means, and a surface support means for engaging a surface of said circuit board; and stanchion means for stabilizing said support structure.

3. The support structure according to claim 2, wherein said circuit board is fitted between said surface support means and said leg member.

4. The support structure according to claim 3, wherein said housing means engages said stanchion means to exert a force on said leg member through said stanchion means to grip said circuit board between said leg member and said surface support means.

* * * * *